United States Patent [19]

Assar et al.

[11] Patent Number: 5,523,724
[45] Date of Patent: Jun. 4, 1996

[54] FAST RECOVERING CHARGE PUMP FOR CONTROLLING A VCO IN A LOW POWER CLOCKING CIRCUIT

[75] Inventors: Mahmud Assar, Morgan Hill; Petro Estakhri, Pleasanton; Boyd Pett, San Jose, all of Calif.

[73] Assignee: Cirrus Logic, Inc., Fremont, Calif.

[21] Appl. No.: 293,676

[22] Filed: Aug. 19, 1994

[51] Int. Cl.[6] .................. H03L 3/00; H03L 7/08; H03L 7/089; H03L 7/10
[52] U.S. Cl. ................. 331/1 A; 331/8; 331/14; 331/17; 331/173
[58] Field of Search .................. 331/1 A, 8, 14, 331/17, 25, 34, 57, 172, 173, 185, DIG. 2

[56] References Cited

U.S. PATENT DOCUMENTS

| | | | |
|---|---|---|---|
| 4,167,711 | 9/1979 | Smoot | 331/8 X |
| 4,675,617 | 6/1987 | Martin | 331/1 A |
| 4,926,141 | 5/1990 | Herold et al. | 331/1 A X |
| 4,931,748 | 6/1990 | McDermott et al. | 331/1 A |
| 4,970,408 | 11/1990 | Hanke et al. | 307/272.3 |
| 4,980,652 | 12/1990 | Tarusawa et al. | 331/16 X |
| 4,987,387 | 1/1991 | Kennedy et al. | 331/1 A |
| 5,057,793 | 10/1991 | Cowley et al. | 331/1 A |
| 5,257,294 | 10/1993 | Pinto et al. | 331/57 X |
| 5,272,453 | 12/1993 | Traynor et al. | 331/57 |
| 5,281,927 | 1/1994 | Parker | 331/57 X |
| 5,359,297 | 10/1994 | Hodel et al. | 331/14 X |

Primary Examiner—David Mis
Attorney, Agent, or Firm—Haverstock & Associates

[57] ABSTRACT

A low power clocking circuit includes a crystal oscillator for generating a digital signal having a first frequency. The first frequency is relatively slow which allows the crystal oscillator to consume reduced power. The phase detector signal is coupled to control a charge pump circuit that generates a voltage on an output node for controlling a voltage controlled oscillator. The VCO generates a clock signal having a second frequency that is higher than the first frequency. The charge pump circuit includes an active mode and a power down mode and is operatively coupled between a first supply voltage and a second supply voltage. As typically provided, the charge pump includes a capacitor network coupled to the output node for maintaining the output voltage. The charge pump includes a voltage control circuit having an up input for increasing the output voltage and a down input for decreasing the output voltage. In addition, a ring enable input is provided for open circuiting all electrical paths from the first supply voltage to the second supply voltage and a precharge circuit is provided for maintaining the output voltage at a predetermined precharge level during the power down mode. Finally, a jump start input controls a jump start circuit for rapidly driving the output voltage to a predetermined level while the charge pump circuit transitions from a power down mode to an active mode. The jump start input includes a single pulse of the digital signal.

28 Claims, 10 Drawing Sheets

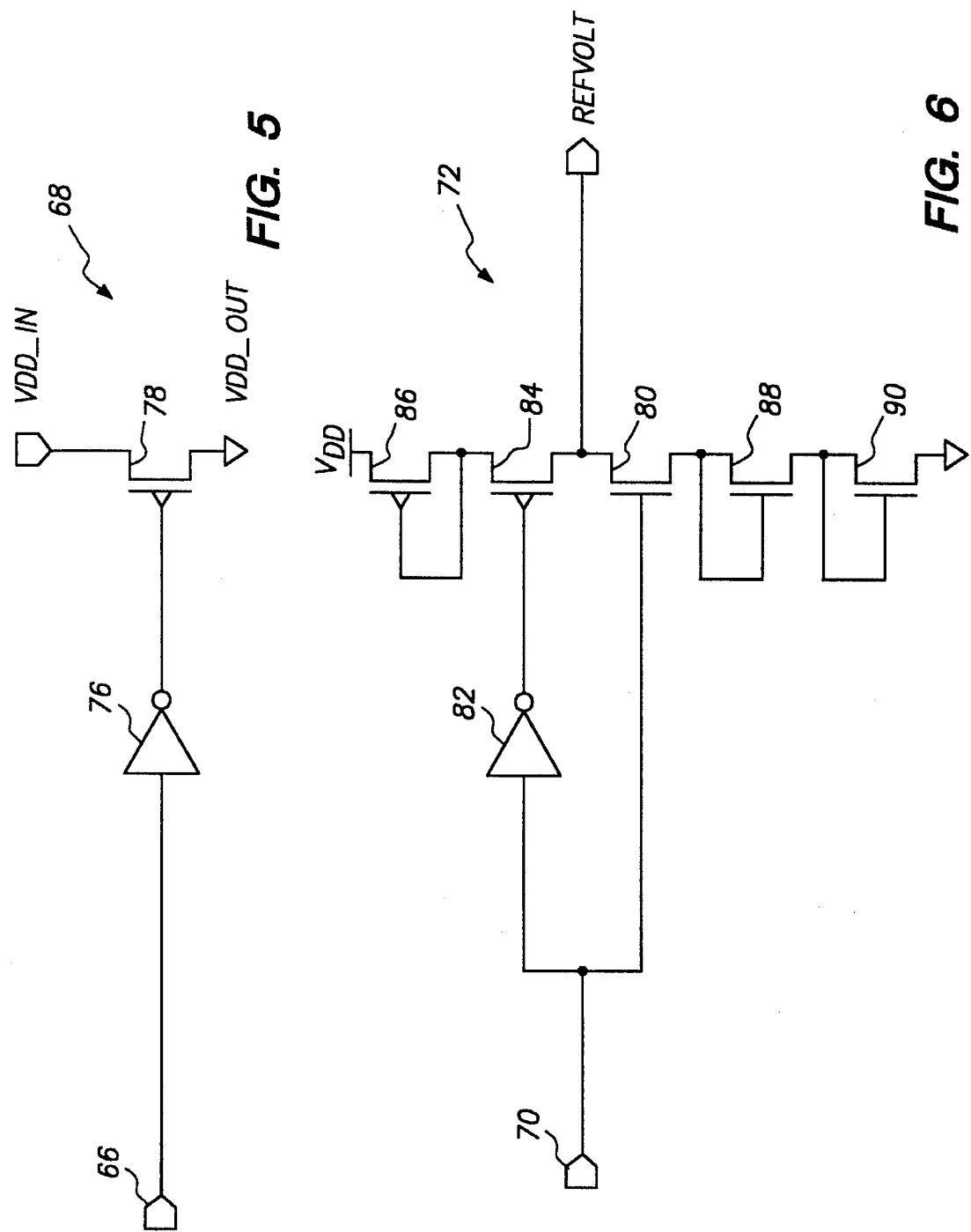

FAST RECOVERING CHARGE PUMP FOR CONTROLLING A VCO IN A LOW POWER CLOCKING CIRCUIT

FIELD OF THE INVENTION

This invention relates to the field of fast clocking circuits with low power requirements. More particularly, this invention relates to a control circuit designed to reduce power consumption without resulting in the deleterious effects associated with loss of system performance.

BACKGROUND OF THE INVENTION

With the increased popularity of clocked portable digital circuits, it has become increasingly important to enhance the operational life of such systems. For example, it is known that so-called lap top and palm top computers can operate with a rechargeable battery or two AA battery cells for between 4 and 8 hours of running time. Once the power source becomes discharged it becomes necessary for the user to recharge the cells or replace the batteries.

Conventional digital systems include a circuit for generating a clock signal such as shown in FIG. 1. A crystal oscillator 20 is provided for generating an oscillating signal. A first resistor 22 is coupled in parallel across the crystal oscillator 20. A first capacitor 24 is coupled between a first terminal of the crystal oscillator 20 and ground. A second capacitor 26 is coupled between the second terminal of the crystal oscillator 20 and ground.

A second resistor 28 is coupled between the second terminal of the crystal oscillator 20 and a clock output terminal 32. A buffer 30 is coupled between the first terminal of the crystal oscillator 20 and the clock output terminal 32. Typically the buffer is an inverting amplifier. A clock signal is applied to the digital system via the clock output terminal 32. It will be apparent to those of ordinary skill in the art that the crystal oscillator 20, the resistors 22 and 28 and the capacitors 24 and 26 are typically formed of so-called external components while in many modern systems the buffer 30 is formed of a portion of an integrated circuit.

Unfortunately, the power drawn by the circuit of FIG. 1 increases as the clock frequency increases. Indeed, in some systems, the clock generating circuit can be the main source of power usage. For portable systems, the faster the clock operates, the higher the current drawn by the system. In effect this lowers the life of the batteries or storage cells. To overcome this problem, others have tried two principle approaches in the prior art.

A first prior art approach to limiting the power drawn by the clock generating circuit is to remove power from the oscillating circuit when the digital system is not in use. In particular, the power is removed from crystal 20. Though this approach significantly reduces the average power drain of the clock generating circuit, this approach does negatively impact the overall performance of digital system. For example, it generally takes between 1 millisecond and 1 second for a system to return to a stable operating frequency after initiating a restart operation from such a powered down condition. Accordingly, this approach is not generally desirable as it significantly reduces system performance.

A second approach to limiting the power drawn by the clock generating circuit is to establish a slow running clock generating circuit by operating the crystal oscillator 20 at a slow frequency. Because the crystal is operating more slowly, this technique draws much less power in the clock generating circuit. However, a frequency multiplying circuit is then required to increase the frequency to the desired level. Power drain improvement can be provided by eliminating power drawn by the multiplier circuit during inactive periods. Though not as deleterious as the first approach, it typically takes between 10 and 20 milliseconds for circuits using this second approach to lock onto a stable operating frequency.

FIG. 2 shows a block diagram of a clock generating circuit. The invention is embodied in the charge pump circuit 144. An oscillator circuit 140 such as that shown in FIG. 1 generates a first clock signal that is coupled to a divider 141 which in turn is coupled to a phase detector circuit 142 such as commonly found in the prior art. The divider 141 and phase detector circuit 142 is also commonly known as a frequency synthesizer circuit. The phase detector 142 generates two signals which are coupled as an up signal and a down input signal to the charge pump circuit 144 of the present invention. The charge pump circuit generates a voltage signal at a predetermined voltage level which is coupled to a voltage controlled oscillator circuit 146. The oscillator 146 can be any well known oscillator such as a ring oscillator. The output of the oscillator circuit 146 is coupled to a divider 147 which in turn is coupled as a second input to the phase detector circuit 142. The phase detector circuit 142 will develop its output signals to cause the charge pump to vary the voltage if the frequency of the oscillator circuit is different from a predetermined ratio of the output of the crystal oscillator circuit 140. The output of the oscillator circuit 146 is also coupled to any well known buffer circuit 148 and is applied to a digital circuit (not shown).

FIG. 3 shows a charge pump input to a prior art clock frequency multiplier circuit. This circuit develops an output voltage that is used to control a voltage controlled oscillator (VCO). The VCO generates the clock signal used by the digital system; the lower the output voltage of this circuit, the faster the clock signal generated in the VCO. The circuit includes two inputs 40 and 42. A charge is maintained on the capacitor network including capacitors 56 and 60. An up input 40 triggers the circuit to generate a falling edge to raise the voltage charge on the capacitor network and a down input 42 triggers the circuit to generate a rising edge to reduce the voltage charge on the capacitor network.

The up input 40 is coupled to the input of an inverting output buffer 44 having an output which in turn is coupled to the input of an inverting output buffer 46. The output of the buffer 46 is coupled to the gate of a P-channel MOS transistor 48. The source of the transistor 48 is coupled to a supply voltage VDD and the drain is coupled to the drain of an N-channel MOS transistor 52 and the first terminal of a resistor 54. The down input 42 is coupled to the input of an inverting output buffer 50 having an output coupled to the gate of the transistor 52. The source of the transistor 52 is coupled to ground.

The second terminal of the resistor 54 is coupled to an output node 62 which controls a voltage controlled oscillator VCO, which is not shown here. A common example of such a VCO circuit is a ring oscillator. A capacitor 56 is coupled between the output node 62 and ground. The first terminal of a resistor 58 is coupled to the output node 62. A capacitor 60 is coupled between the second terminal of the resistor 58 and ground.

Once the power is removed from this circuit, the voltages stored on the two capacitors 56 and 60 decays due to parasitic losses. If the transistor 52 is left in the on state, it will discharge the node 62 even more quickly. In addition, there exists a potential path for power dissipation through the two transistors 48 and 52. Thus, upon power up, the voltage applied to the VCO is at a significantly lower level so that the clock signal generated by the VCO is too fast. The clock signal generated by the VCO will not return to its predetermined designed frequency until the output voltage of the charge pump returns to its predetermined level.

For a variety of reasons, some digital systems cannot operate properly with a clock signal at too fast a frequency. It is possible that the frequency is so fast that the synthesizer will fail to operate. Even if the oscillator operates, the divider may fail to function properly thereby causing the phase detector to fail because there is no appropriate input signal. Those systems will need to have the clock signal withheld until the signal approaches the desired frequency further reducing the system performance.

What is needed is a clock generating circuit that draws less power. What is also needed is a clock generating circuit that can stabilize to the desired frequency within a predetermined short time.

SUMMARY OF THE INVENTION

A low power clocking circuit includes a crystal oscillator for generating a digital signal having a first frequency. The first frequency is relatively slow which allows the crystal oscillator to consume reduced power. The phase detector signal is coupled to control a charge pump circuit that generates a voltage on an output node for controlling a voltage controlled oscillator. The VCO generates a clock signal having a second frequency that is higher than the first frequency. The charge pump circuit includes an active mode and a power down mode. As typically provided, the charge pump includes a capacitor network coupled to the output node for maintaining the output voltage. The charge pump includes a voltage control circuit having an up input for increasing the output voltage and a down input for decreasing the output voltage. In addition, a ring enable input is provided for open circuiting all electrical paths from the first supply voltage to the second supply voltage and a precharge circuit is provided for maintaining the output voltage at a predetermined precharge level during the power down mode. Finally, a jump start input controls a jump start circuit for rapidly driving the output voltage to a predetermined level while the charge pump circuit transitions from a power down mode to an active mode. The jump start input includes a single pulse of the digital signal.

BRIEF DESCRIPTION OF THE DRAWINGS

FIG. 5 shows a more detailed schematic of the power switch circuit 68.

FIG. 6 shows a more detailed schematic diagram of the jump start circuit illustrated as a circuit block in FIG. 4.

DETAILED DESCRIPTION OF THE PREFERRED EMBODIMENT

Figure 2:
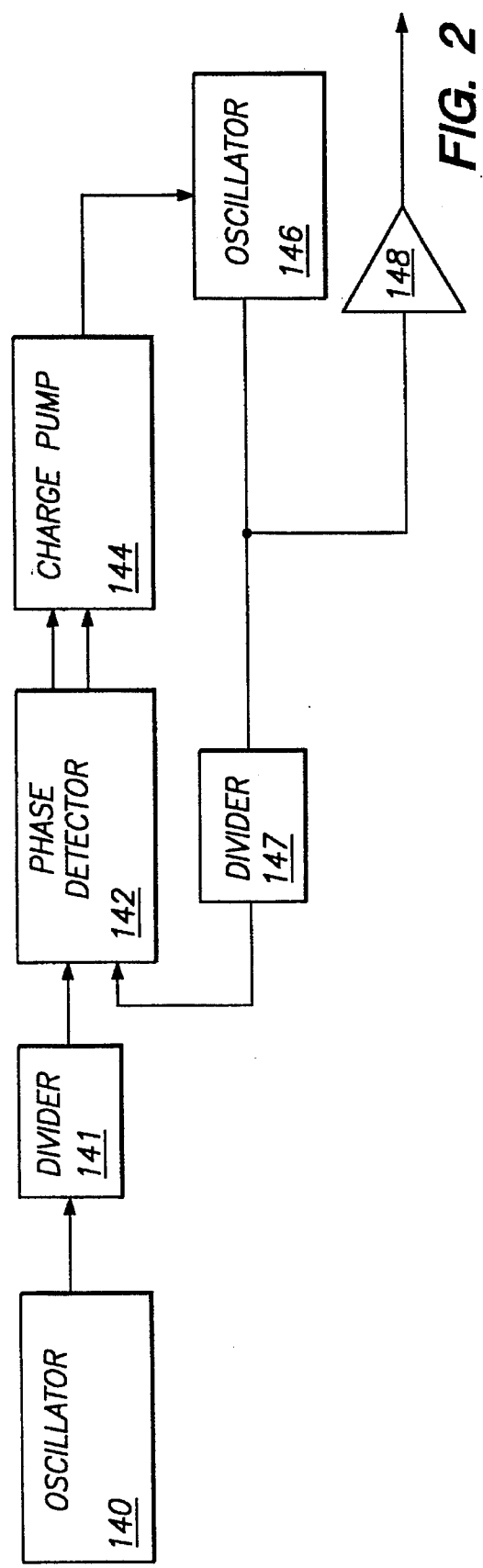
FIG. 2 shows a block diagram of a clock generating circuit wherein the invention lies within the block for the charge pump circuit.
Figure 3:
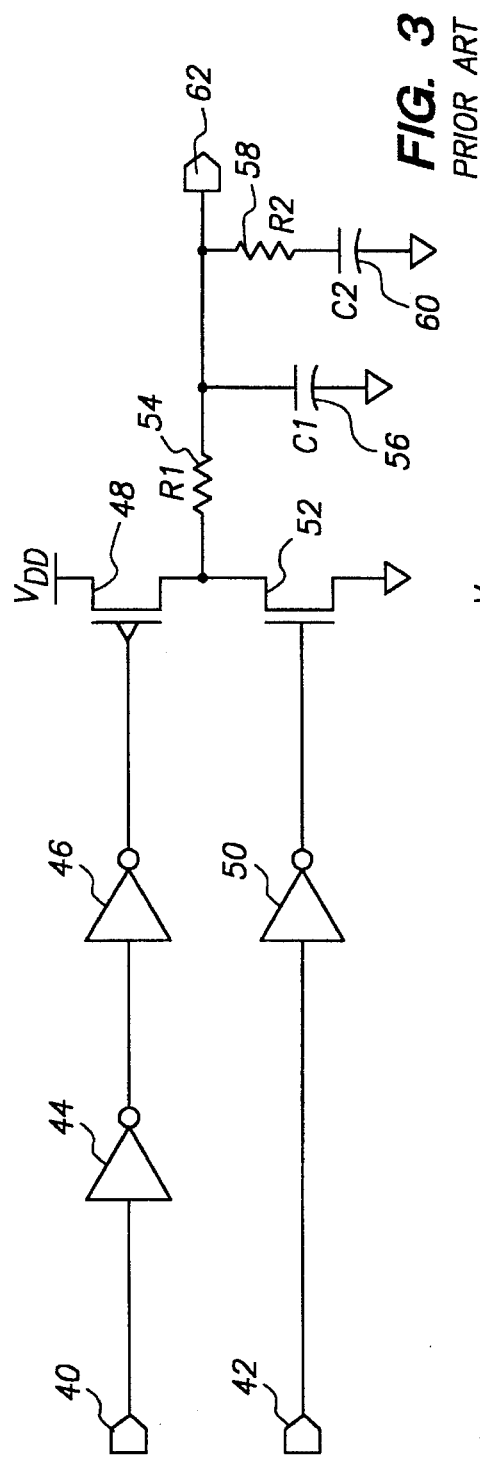
FIG. 3 shows a prior art charge pump circuit that is used as an input to a clock frequency multiplier circuit.
Figure 4:
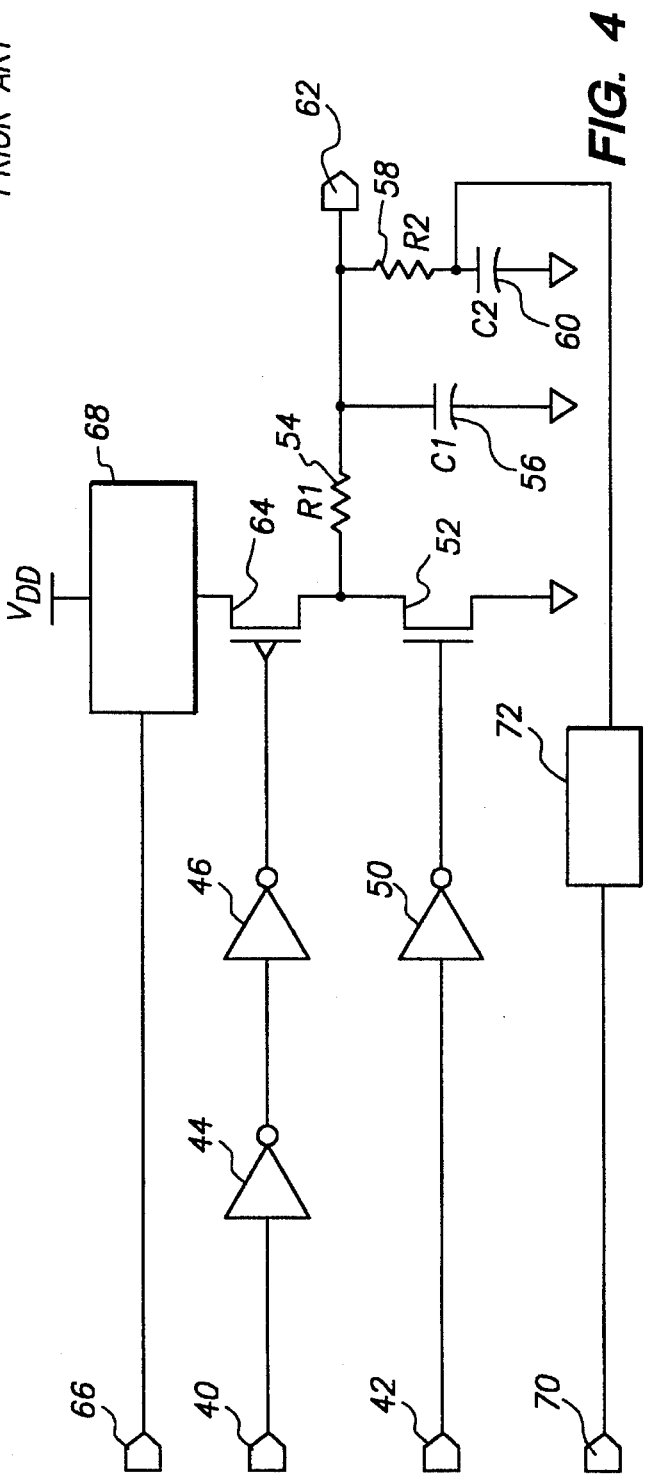
FIG. 4 shows a circuit diagram of the charge pump of the present invention.

The present invention utilizes a lower power crystal oscillator and a charge pump circuit to generate a control voltage for a VCO which synthesizes a clock signal for a digital system. FIG. 4 shows a simplified circuit and block diagram of the charge pump of the present invention. Portions of the charge pump circuit are the same as for the prior art circuit of FIG. 3. Corresponding circuit elements between FIGS. 2 and 3 are provided the same reference numerals to avoid obscuring the invention. As with the prior art circuit of FIG. 3, the circuit of FIG. 4 generates a control voltage for a VCO that is not shown.

This circuit also includes two inputs, an up input 40 and a down input 42 which is generated by the phase detector circuit as a reference voltage. The up input 40 is coupled to the input of an inverting output buffer 44 having an output which in turn is coupled to the input of an inverting output buffer 46.

The output of the buffer 46 is coupled to the gate of a P-channel MOS transistor 64. The source of the transistor 64 is coupled to a power switch circuit 68 and the drain is coupled to the drain of an N-channel MOS transistor 52 and the first terminal of a resistor 54. The down input 42 is coupled to the input of an inverting output buffer 50 having an output coupled to the gate of the transistor 52. The source of the transistor 52 is coupled to ground.

The second terminal of the resistor 54 is coupled to an output node 62 which controls a voltage controlled oscillator VCO, which is not shown here. A common example of such a VCO circuit is a ring oscillator. A capacitor 56 is coupled between the output node 62 and ground. The first terminal of a resistor 58 is coupled to the output node 62. A capacitor 60 is coupled between the second terminal of the resistor 58 and ground.

In addition to the two inputs of the prior art, the circuit of FIG. 4 also includes a ring enable input 66 and a jump start input 70. The ring enable input 66 is coupled to control the power switch circuit 68. The power switch circuit 68 is coupled between the power supply terminal VDD and the source of the transistor 64. The power switch enable circuit 68 virtually eliminates any circuit power drain during a power down mode of operation.

FIG. 5 shows a more detailed schematic of the power switch circuit 68 of FIG. 4. The ring enable input 66 is coupled to the input of an inverting output buffer 76. The output of the buffer 76 is coupled to the gate of a P-channel MOS transistor 78. The source of the transistor 78 is coupled to the supply voltage VDD and its drain is coupled to the source of the transistor 64 (FIG. 4). By applying the appropriate voltage to the ring enable input 66 the transistor 78 is operated in the cut-off mode effectively disabling the circuit of FIG. 4 and preventing it from drawing power. When the ring enable input 66 is at a low voltage level, the output of the inverting output buffer 76 is at a high voltage. This high voltage cuts off the transistor 78 effectively eliminating the supply voltage VDD from the circuit of FIG. 4. When the ring enable input 66 is at a high voltage, the output of the inverting output buffer 76 is at a low voltage. This low voltage operates the transistor 78 in saturation mode which couples the supply voltage Vdd to the source of the transistor 64 (FIG. 4).

Returning to FIG. 4, a jump start input 70 is coupled to a jump start circuit 72. The output of the jump start circuit 72 is coupled to the second terminal of the resistor 58 and a first terminal of the capacitor 60. This circuit significantly reduces the time that it takes the circuit of the present invention to achieve a stabilized frequency by quickly forcing the voltage at the node 62 to a voltage at or near a level necessary to develop the desired clock frequency. During the time that the VCO is reactivated, the jump start circuit 72 forces the node 62 to more quickly return to the desired voltage and thereby the desired frequency.

FIG. 6 shows a more detailed schematic diagram of the jump start circuit 72 of FIG. 4. The jump start input 70 is coupled to the gate of an N-channel MOS transistor 80 and to the input of an inverting output buffer 82. The output of the buffer 82 is coupled to the gate of a P-channel MOS transistor 84. The source of the transistor 84 is coupled to the drain and the gate of a diode connected P-channel MOS transistor 86. The source of the transistor 86 is coupled to the supply voltage VDD.

The drain of the transistor 84 is coupled to the drain of the transistor 80. The source of the transistor 80 is coupled to the drain and the gate of a diode connected N-channel MOS transistor 88. The source of the transistor 88 is coupled to the drain and gate of a diode connected N-channel MOS transistor 90. The source of the transistor 90 is coupled to ground. The output of the jump start circuit is the node between the drains of the transistors 80 and 84, which in turn are coupled to the node between the resistor 58 and the capacitor 60 (FIG. 4).

Figure 1:
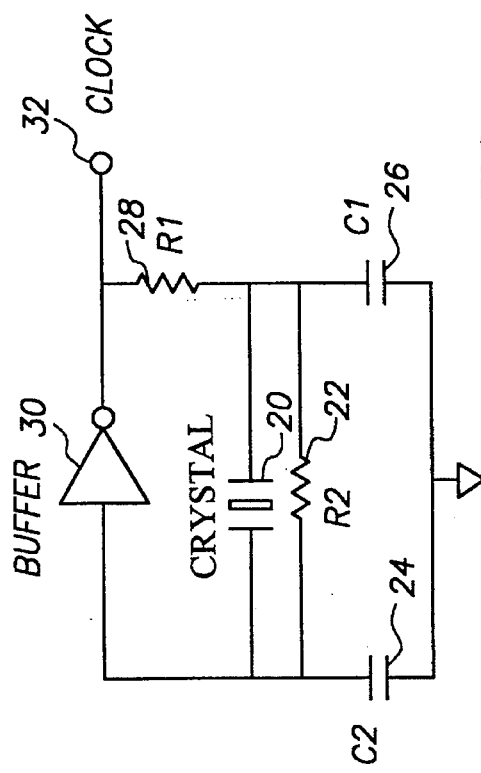
FIG. 1 shows a conventional circuit for generating a clock signal in a digital system.

The jump start input 70 is at a logical low voltage level at all times except when the clock signal is being reactivated. At the normal low level, the transistors 80 and 84 are both cut-off so that no current is drawn by the jump start circuit during normal operation. During a reactivation cycle, a single crystal oscillator pulse (from FIG. 1) is coupled as the jump start input 70. During the time, that the jump start input 70 is high, the transistors 80 and 84 are both on and conducting. The output voltage of the circuit is designed to be approximately that intended to be stored across the capacitor 60. Thus, the jump start circuit of FIG. 6 significantly reduces the time that it takes this overall subsystem to quickly achieve a stable operating frequency.

During a power down sequence, the power is removed from the circuit of FIG. 4 by lowering the ring enable input 66 (FIG. 5). Once the power is removed from this circuit, the voltages stored on the two capacitors 56 and 60 begin to decay due to parasitic losses. Thus, upon power up, the voltage applied to the VCO is at a significantly reduced level so that the clock signal applied to the digital system is quite fast. Because some systems cannot operate properly at too high a frequency, those systems will need to have the clock signal withheld until the signal approaches the desired frequency.

Figure 7:
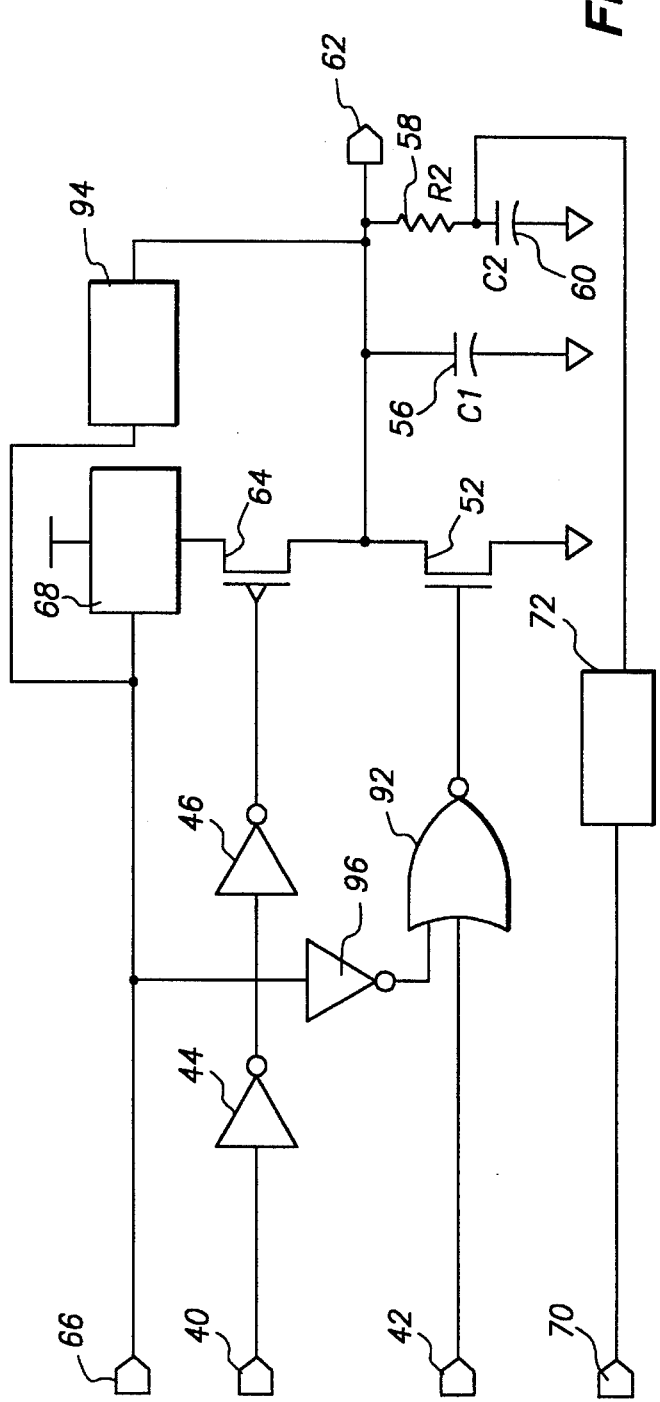
FIG. 7 shows a block diagram of an alternate circuit of that shown in FIG. 4.

FIG. 7 shows a block diagram of an alternate embodiment of the circuit of FIG. 4. Those elements that are identical between the two circuits will be identified with the same reference numerals in the drawings of FIG. 4 and FIG. 7. This circuit also includes two inputs 40 and 42. An up input 40 triggers the circuit to raise the voltage generated at the output 62 and a down input 42 triggers the circuit to lower the voltage generated a falling edge. These two inputs are controlled by a phase detector circuit such as shown in FIG. 2. The up input 40 is coupled to the input of an inverting output buffer 44 having an output which in turn is coupled to the input of an inverting output buffer 46.

The output of the buffer 46 is coupled to the gate of a P-channel MOS transistor 64. The source of the transistor 64 is coupled to a power switch circuit 68 and the drain is coupled to the drain of an N-channel MOS transistor 52. The down input 42 is coupled to the input of a two input NOR gate 92 having an output coupled to the gate of the transistor 52. The source of the transistor 52 is coupled to ground.

The drain of the transistor 52 is coupled to the output node VCO_Control 62 which controls a voltage controlled oscillator VCO, which is not shown here. A common example of such a VCO circuit is a ring oscillator. A capacitor 56 is coupled between the output node 62 and ground. The first terminal of a resistor 58 is coupled to the output node 62. A capacitor 60 is coupled between the second terminal of the resistor 58 and ground.

A ring enable input 66 is coupled to control a power switch circuit 68, a ring enable circuit 94 and to the input of an inverting output buffer 96. The power switch circuit 68 is coupled to the power supply terminal VDD. The power switch enable circuit 68 virtually eliminates any parasitic power drain during a power down mode of operation.

The precharge circuit provides power to the output to hold the control voltage for the voltage controlled oscillator at no lower than a predetermined level. The output of the inverting output buffer 96 is coupled to the second input of the NOR gate 92.

Figure 8:
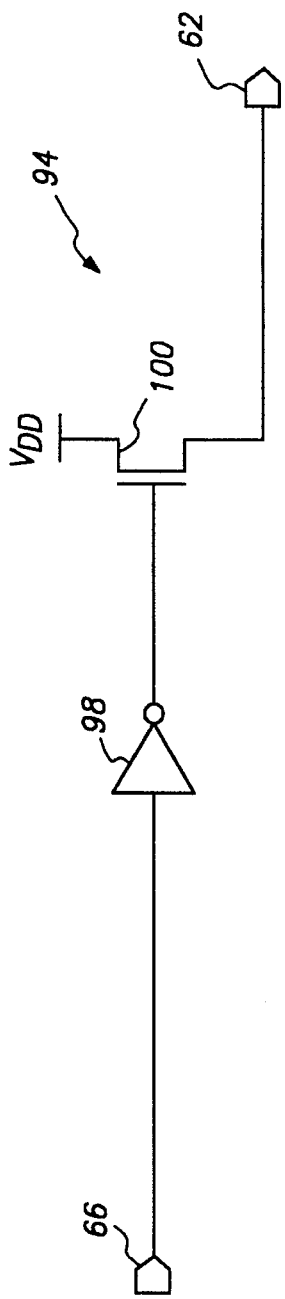
FIG. 8 shows a block diagram of a precharge circuit for the circuit of FIG. 7.

FIG. 8 shows a schematic block diagram of the precharge circuit 94 of FIG. 7. The ring enable input 66 is coupled to an n-channel MOS transistor 100 through an inverted output buffer 98. The drain of the transistor 100 is coupled to VDD. The source of the transistor 100 is the output of the ring enable circuit and is coupled to the output of the circuit VCO_Control (FIG. 7). The precharge circuit 94 helps to hold the output of the circuit at a predetermined level. That level is VDD minus a threshold voltage.

Figure 9A:
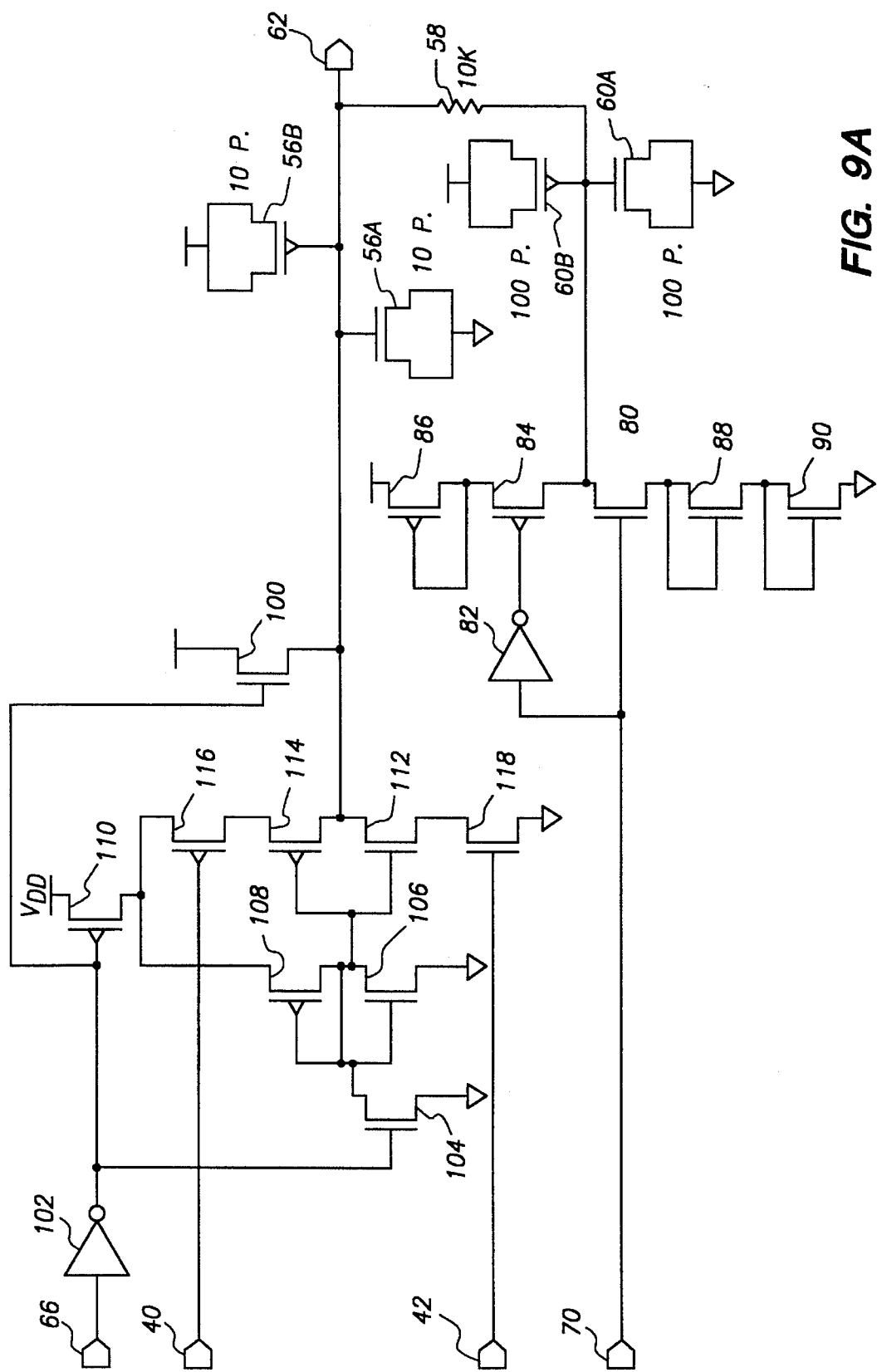
FIG. 9A shows a more detailed circuit schematic for the circuit of FIG. 7.

FIG. 9A shows another alternate embodiment of the circuit of FIG. 7. Those elements that are common to the circuit of FIG. 7 will be labeled with the same reference numerals. The up input 40 is coupled to the gate of a P-channel transistor 116. Though not identical, the transistor 116 corresponds in function to the transistor 64 (FIG. 7). The source of the transistor 116 is coupled to the drain of a P-channel transistor 110 and to the source of a diode connected P-channel transistor 108. The drain of the transistor 116 is coupled to the source of a P-channel transistor 114. The drain of the transistor 114 is coupled to the output of the circuit 62. The output 62 is coupled to a VCO.

The down input 42 is coupled to the gate of an N-channel transistor 118. Though not identical, the transistor 118 corresponds in function to the transistor 52 (FIG. 7). The source of the transistor 118 is coupled to ground. The drain of the transistor 118 is coupled to the source of an N-channel transistor 112. The drain of the transistor 112 is coupled to the output 62.

The ring enable input 66 is coupled to the input of an output inverting buffer 102. In the circuits of FIGS. 4, 6 and 7, three output inverting buffers 76, 98 and 96 are shown. In this circuit of FIG. 9A, those three buffers are combined into the single buffer 102. Accordingly, the output of the buffer 102 is coupled to the gate of the transistor 100, the gate of the transistor 110 and to the gate of an N-channel transistor 104. The source of the transistor 110 is coupled to the supply voltage VDD, the drain of the transistor 100 is also coupled to VDD. The source of the transistor 100 is coupled to the output 62.

The source of the transistor 104 is coupled to ground. The drain of the transistor 104 is coupled to the gate and drain of the diode connected transistor 108, to the gate and drain of a diode connected N-channel transistor 106 and to control the gates of the transistors 112 and 114.

As in the circuit of FIG. 7, the output 62 is coupled to a capacitor and a resistor-capacitor network. Because this embodiment is designed to be manufactured as an integrated circuit on an MOS technology, the capacitors are formed of the gate to channel capacitance. In this embodiment, each capacitor of FIG. 7 is substituted with a pair of capacitors, one coupled to ground and the other to the supply voltage VDD. A first pair of capacitors includes a capacitor 56A having its gate coupled to the output 62 and its source and drain coupled to ground. A capacitor 56B has its gate coupled to the output 62 and its source and drain coupled to the supply VDD.

A resistor 58 has a first terminal coupled to the output 62. A second pair of capacitors includes a capacitor 60A having its gate coupled to a second terminal of the resistor 58 and its source and drain coupled to ground. A capacitor 60B has its gate coupled to the second terminal of the resistor 58 and its source and drain coupled to the supply VDD.

The jump start input 70 is coupled to the gate of an N-channel MOS transistor 80 and to the input of an inverting output buffer 82. The output of the buffer 82 is coupled to the gate of a P-channel MOS transistor 84. The source of the transistor 84 is coupled to the drain and the gate of a diode connected P-channel MOS transistor 86. The source of the transistor 86 is coupled to the supply voltage VDD.

The drain of the transistor 84 is coupled to the drain of the transistor 80. The source of the transistor 80 is coupled to the drain and the gate of a diode connected N-channel MOS transistor 88. The source of the transistor 88 is coupled to the drain and gate of a diode connected N-channel MOS transistor 90. The source of the transistor 90 is coupled to ground. The output of the jump start circuit is the node between the drains of the transistors 80 and 84, which in turn are coupled to the second terminal of the resistor 58.

As with the circuit of FIG. 7, the jump start input 70 is at a logical low voltage level at all times except when the clock signal is being reactivated. At the normal low level, the transistors 80 and 84 are both cut-off so that no current is drawn by the jump start circuit during normal operation. During a reactivation cycle, a single crystal oscillator pulse (from FIG. 1) is coupled as the jump start input 70. During the time, that the jump start input 70 is high, the transistors 80 and 84 are both on and conducting. Because of the diode connected transistors in this circuit, the output voltage of the circuit is designed to be approximately that intended to be stored across the capacitor 60. Thus, the jump start circuit reduces the time to about one crystal oscillator pulse that it takes this overall subsystem to quickly achieve a stable operating frequency.

In power down mode, the ring enable input is low so the output of the buffer 102 is high. With a high voltage on its gate, the transistor 110 is cut off thereby removing the supply voltage from all the transistors 104, 106, 108, 114 and 116 and thus, these transistors are unable to draw current or power. Recall that the jump start input 70 is always low except during a single crystal clock pulse during a restart operation. Accordingly, with a low voltage coupled to its gate the transistor 80 is cut off so none of the transistors 80, 84, 86, 88 and 90 in the jump start circuit can draw current or power.

With a high voltage on its gate the transistor 100 of the precharge circuit is on. However, with a high voltage on its gate, the channel of the transistor 104 will be inverted so that its drain is at a low voltage level. With a low voltage coupled to its gate, the transistor 112 is cut off. Thus, there is no path for current from the transistor 100, so that no current flows in the charge pump circuit of FIG. 9A during power down mode. Note however, that the precharge transistor 100 will serve to maintain the voltage level stored on the capacitors at approximately VDD minus a threshold voltage. Thus, if the charge on the capacitors 56A, 56B, 60A or 60B leaks due to the operation of parasitic effects during power down mode, the transistor 100 will draw such power as necessary to overcome those leakage currents. This power consumption will be negligible.

During active operation, the jump start input 70 is at a low voltage level so no current flows in the transistors 80, 84, 86, 88 and 90 as discussed above. The ring enable input is at a high voltage level so output of the buffer 102 is low. The transistor 100 is cut off so the voltage on the output is solely under control of the up input 40 and the down input 42. With a low input voltage on its gate the transistor 110 is saturated coupling the supply voltage VDD to the transistors 104, 106, 108, 112, 114, 116 and 118. The voltage on the gate of the transistor 104 is low so that transistor is cut off. Its drain voltage is controlled by the diode connected transistors 106 and 108. Thus, the transistors 112 and 114 are both on and conducting. When the voltage applied to the up input 40 and to the down input 42 is high, the transistor 116 is cut off and the transistor 118 is on. This will reduce the voltage on the output 62 by providing a discharge path through the transistors 112 and 118. Similarly, when the voltage applied to the up input 40 and to the down input 42 is low, the transistor 118 is cut off and the transistor 116 is on. This will increase the voltage on the output 62 by providing a charging path through the transistors 114, 116 and 110. The up input 40 and the down input 42 are controlled in the usual manner.

Figure 9B:
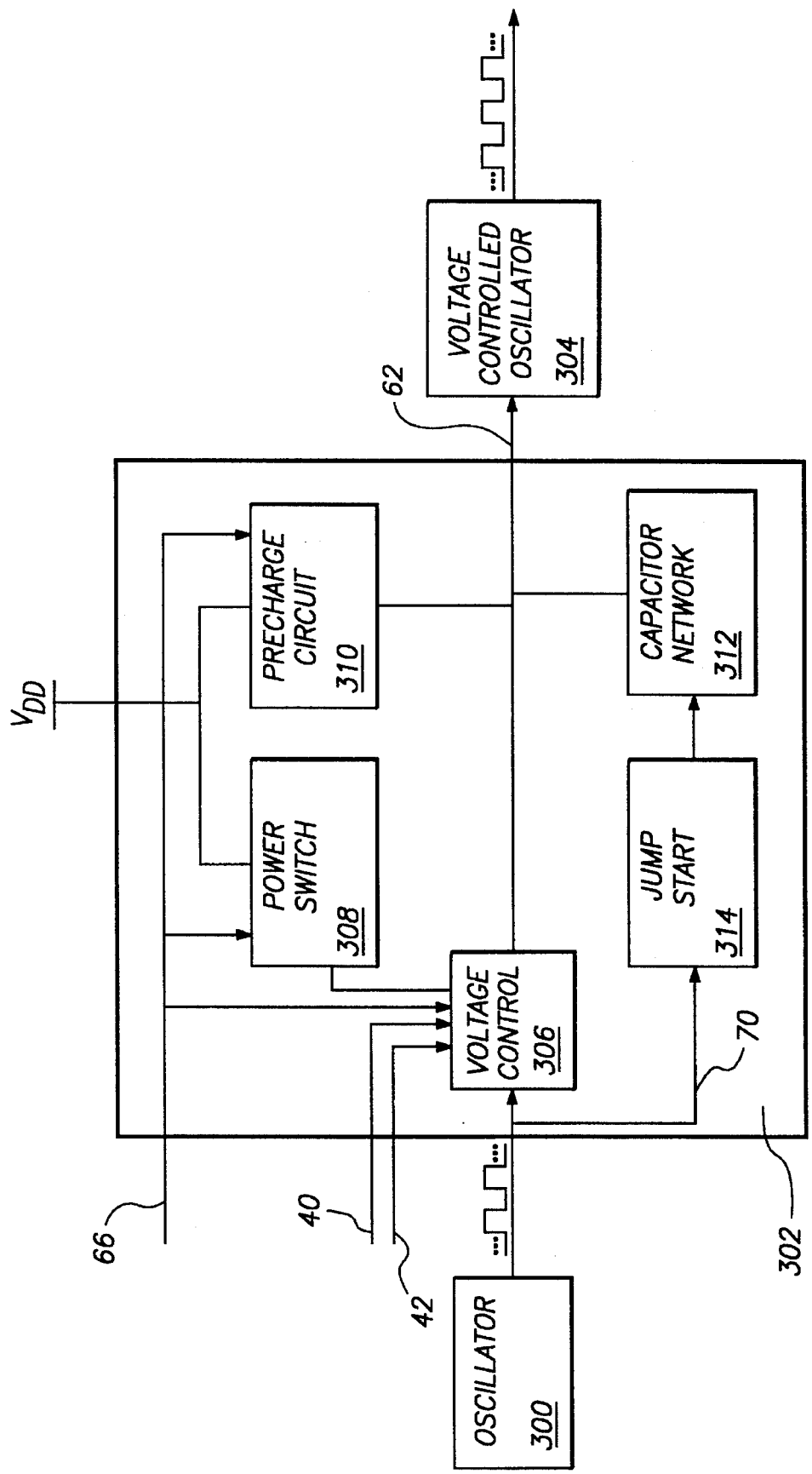
FIG. 9B shows a block diagram of a low power clock generating circuit according to the present invention.

FIG. 9B shows a block diagram of a low power clock generating circuit according to the present invention which utilized the charge pump circuit of FIG. 9A. Where appropriate the reference numerals in FIG. 9A will be duplicated to facilitate understanding of the invention. A crystal oscillator 300 generates a digital signal having a first frequency and provide that signal to a charge pump circuit 302. The charge pump circuit 302 generates an output voltage on its output node 62 for controlling a VCO 304. The VCO 304 generates a clock signal for controlling a digital system. The clock signal has a higher frequency than the digital signal.

The charge pump circuit includes a voltage control circuit 306 that generates and controls the voltage on the output node 62. The output voltage is maintained on a capacitor network 312. As described above, the voltage control circuit includes an up input 40 and a down input 42. A ring enable signal 66 is coupled to control the voltage control circuit 306, a power switch circuit 308 and a precharge circuit 310. In power down mode under control of the ring enable input 66, the power switch 308 disconnects the power supply VDD from the voltage control circuit 306, the precharge circuit maintains the output node 62 at a predetermined level while preventing a current path from the precharge circuit through the voltage control circuit 306 to ground.

During a transition from a power down mode to an active mode, the jump start circuit 314 reduces the time it takes the VCO 304 to generate the desired clock signal. A single pulse from the crystal oscillator is coupled via the jump start input 70 to the jump start circuit 314. The jump start circuit 314 generates a voltage signal that drives the capacitor network 312 to a desired output voltage thereby significantly reducing the recovery time after power down mode.

Figure 10:
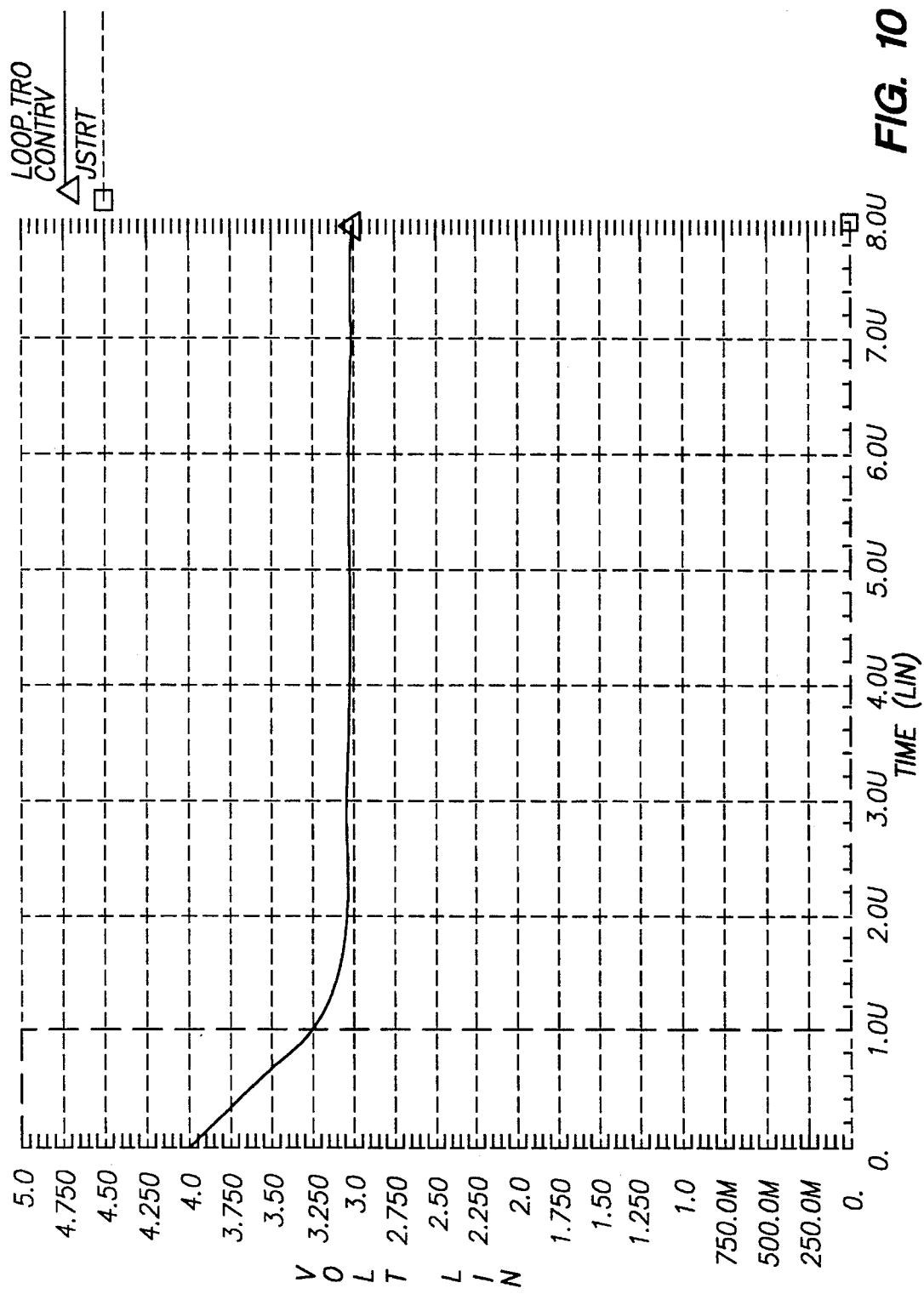
FIG. 10 shows a graphical representation of the output voltage of the charge pump of FIG. 8 versus time.

FIG. 10 shows a graph of simulated data for the circuits of FIG. 9A and 9B Two curves are shown. As is shown, the jump start signal is at a high level from 0 µSeconds to 1 µSeconds and then at zero volts thereafter. This period of time represents a single crystal clock pulse. The voltage on the output 62 (FIG. 9A) is ≈4 volts prior to initiation of the restart operation. The clock signal generated by the VCO (not shown) for this voltage level is ≈10 MHz. For many applications, this clock frequency is unacceptable and the system must wait until the clock frequency stabilizes at the designed frequency. After one µSecond, the voltage on the output 62 has dropped to ≈3.25; the clock signal generated by the VCO for this voltage is ≈14 MHz. This frequency is satisfactory for most digital systems. Thus, the charge pump according to the present invention draws reduced power and a clock operating with this circuit reaches an acceptable frequency within a single µSecond. After one more µSecond, the voltage on the output 62 has dropped to ≈3.05 volts which is essentially the ideal voltage for the application in which this circuit is intended to operate. The resultant clock signal for this voltage is ≈16 MHz. Though modest fluctuations are evident, the effect on the clock frequency is negligible. Thus, the clock frequency according to the present invention stabilizes for essentially all practical purposes after a mere 2 µSeconds.

Figure 11:
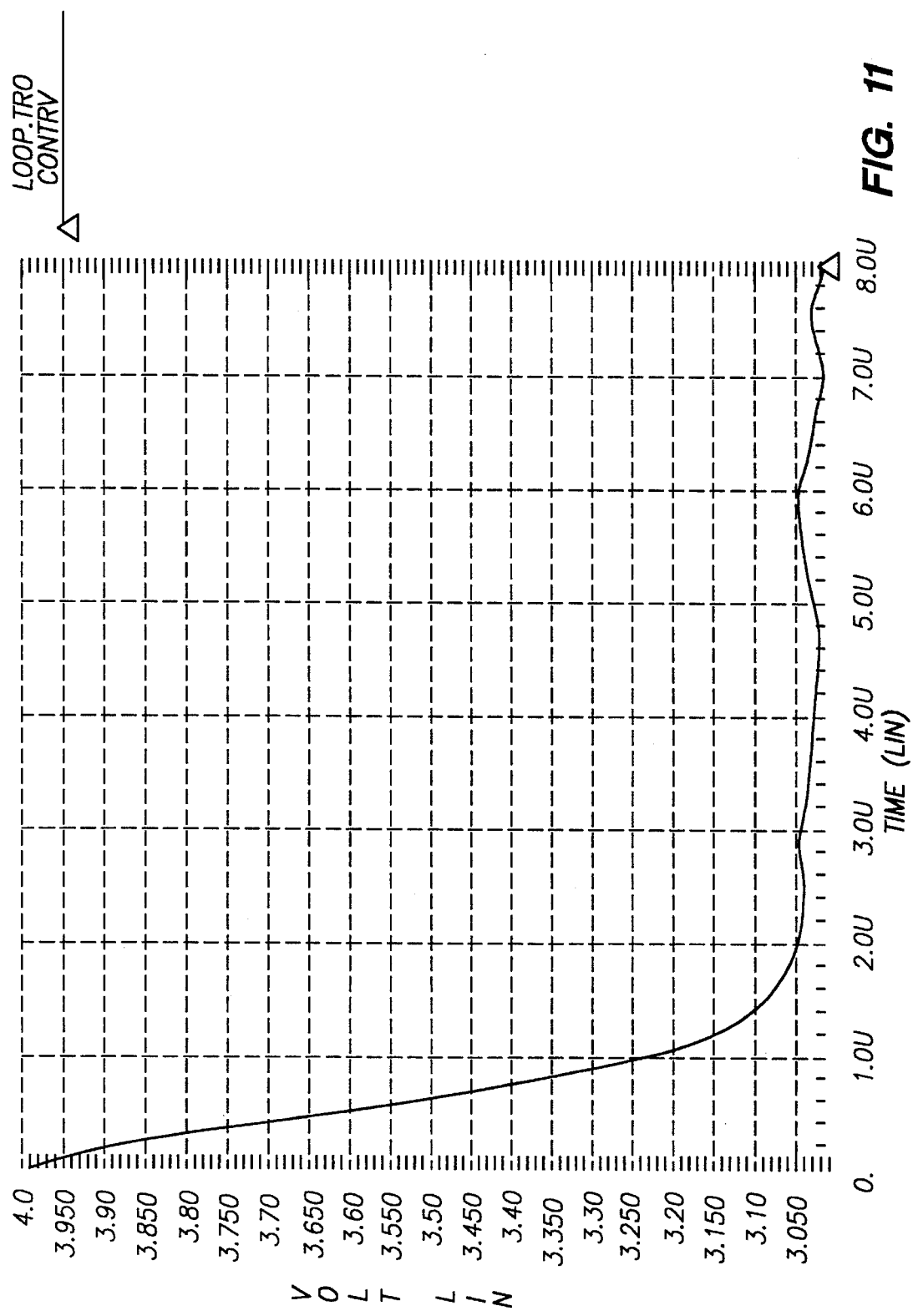
FIG. 11 shows a portion of the graphical representation of FIG. 10 with an expanded voltage scale.

FIG. 11 shows the voltage on the output 62 with an expanded voltage scale. The fluctuations of about 0.02 volts in the output voltage can be seen.

Figure 12:
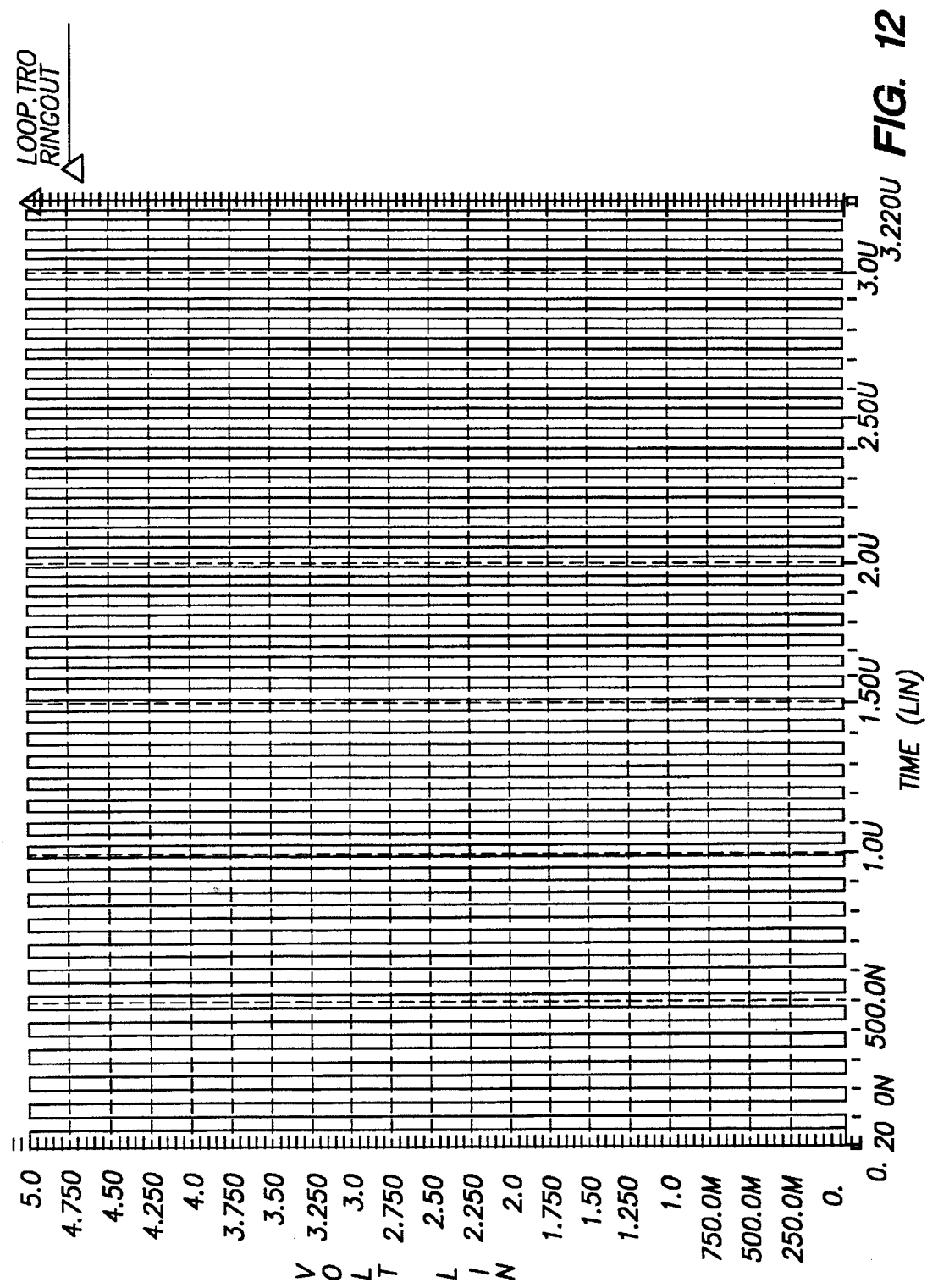
FIG. 12 shows a graphical representation of a clock signal versus time generated by a VCO controlled by the voltage signal of FIG. 9A.

FIG. 12 shows the clock signal generated by a VCO controlled by the output of the charge pump of FIG. 9A for the first 3.25 µSeconds from the initiation of a restart operation. As can clearly be seen, the frequency of the clock signal rapidly increases during the first 1.0 µSeconds to quickly approximate the desired frequency. Thereafter, the changes are substantially less as the remaining fluctuations in the output voltage of the charge pump circuit diminish.

Figure 13:
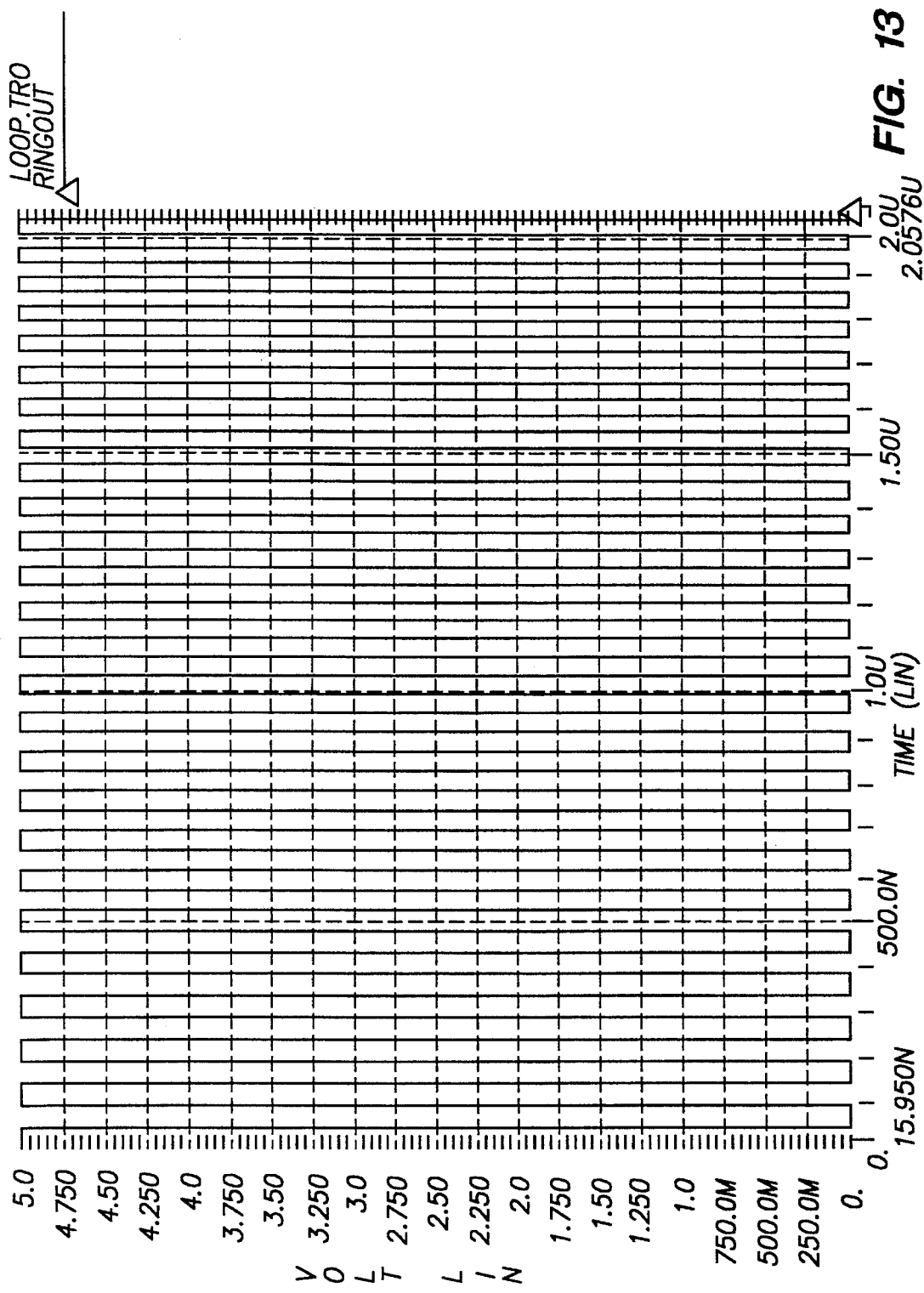
FIG. 13 shows a portion of the graphical representation of clock signal of FIG. 12 with an expanded time scale.

FIG. 13 shows the same clock signal as shown in FIG. 12 except the time scale is expanded. Only the first 2 µSeconds after the initiation of a restart operation are shown.

A charge pump to control a VCO in a low power clock generating circuit is described. Any modifications which become apparent to one of ordinary skill in the art only after reading this disclosure are deemed within the spirit and scope of this invention.

What is claimed is:

1. A low power clocking circuit for generating a clock signal, the clocking circuit having an active mode and a power down mode, the clocking circuit comprising:

a. a crystal oscillator for generating a repetitive digital signal having a first frequency;

b. a phase detector circuit, coupled to receive the repetitive digital signal for generating an up signal and a down signal;

c. a charge pump circuit coupled to receive the up signal for generating a control voltage, wherein the up input signal increases the control voltage and a down input signal decreases the control voltage wherein the charge pump circuit comprises a jump start input for rapidly driving the output voltage to a predetermined level while the charge pump circuit transitions from the power down mode to the active mode;

d. a precharge circuit for maintaining the control voltage at a predetermined precharge level during the power down mode; and e. a voltage controlled oscillator coupled to receive the control voltage and generate a clock signal having a second frequency wherein the second frequency is higher than the first frequency.

2. The low power clocking circuit according to claim 1 further comprising a supply voltage, a ground and a ring enable input for open circuiting all electrical paths from the supply voltage to the ground during the power down mode.

3. The low power clocking circuit according to claim 1 wherein the charge pump comprises a charge storage element coupled to generate the control voltage and further wherein the precharge circuit conducts a current during the power down mode wherein the current is merely sufficient to compensate for charge lost from the storage element due to leakage.

4. A low power clocking circuit for generating a clock signal, the clocking circuit having an active mode an a power down mode, the clocking circuit comprising:

a. a crystal oscillator for generating a repetitive digital signal having a first frequency;

b. a charge pump circuit coupled to receive the repetitive digital signal for generating a control voltage the charge pump circuit having an up input for increasing the control voltage an a down input for decreasing the control voltage wherein the charge pump circuit comprises a supply voltage, a ground and a ring enable input for open circuiting all electrical paths from the supply voltage to the ground during the power down mode;

c. a precharge circuit for maintaining the control voltage at a predetermined precharge level during the power down mode; and d. a voltage controlled oscillator coupled to receive the control voltage and generate a clock signal having a second frequency wherein the second frequency is higher than the first frequency.

5. The low power clocking circuit according to claim 4 further comprising a jump start input for rapidly driving the output voltage to a predetermined level while the charge pump circuit transitions from the power down mode to the active mode.

6. The lower power clocking circuit according to claim 4 wherein the charge pump comprises a charge storage element coupled to generate the control voltage and further wherein the precharge circuit conducts a current during the power down mode wherein the current is merely sufficient to compensate for charge lost from the storage element due to leakage.

7. A lower power clocking circuit for generating a clock signal, the clocking circuit having an active mode and a power down mode, the clocking circuit comprising:

a. a crystal oscillator for generating a repetitive digital signal having a first frequency;

b. a charge pump circuit coupled to receive the repetitive digital signal for generating a control voltage the charge pump circuit having an up input for increasing the control voltage and a down input for decreasing the control voltage wherein the charge pump circuit comprises a precharge circuit for maintaining the control voltage at a predetermined precharge level during the power down mode;

c. a voltage controlled oscillator coupled to receive the control voltage and generate a clock signal having a second frequency wherein the second frequency is higher than the first frequency.

8. The low power clocking circuit according to claim 7 further comprising a supply voltage, a ground and a ring enable input for open circuiting all electrical paths from the supply voltage to the ground during the power down mode.

9. The low power clocking circuit according to claim 7 further comprising a jump start input for rapidly driving the output voltage to a predetermined level while the charge pump circuit transitions from the power down mode to the active mode.

10. The low power clocking circuit according to claim 7 wherein the charge pump comprises a charge storage element coupled to generate the control voltage and further wherein the precharge circuit conducts a current during the power down mode wherein the current is merely sufficient to compensate for charge lost from the storage element due to leakage.

11. A low power charge pump circuit for controlling a voltage controlled oscillator, wherein the charge pump circuit includes an active mode and a power down mode, the charge pump circuit comprising:

a. a first supply voltage;

b. a second supply voltage;

c. an output node;

d. a capacitor network coupled to the output node for maintaining an output voltage;

e. a voltage control circuit coupled between the first supply voltage and the second supply voltage for controlling the output voltage, the voltage control circuit having an up input for increasing the output voltage and a down input for decreasing the output voltage;

f. a ring enable input for open circuiting all electrical paths from the first supply voltage to the second supply voltage during the power down mode;

g. a precharge circuit for maintaining the output voltage at a predetermined precharge level during the power down mode; and h. a jump start input for rapidly driving the output voltage to a predetermined level while the charge pump circuit transitions from a power down mode to an active mode.

12. The low power charge pump circuit according to claim 11 wherein the second supply voltage is a ground potential.

13. The low power charge pump circuit according to claim 11 wherein the up input is coupled to a charging circuit and the down input is coupled to a discharging circuit and further wherein the ring enable input has a first state and a second state and is coupled to activate the charging circuit and the discharging circuit in the first state and to disable the charging circuit and the discharging circuit in the second state.

14. The low power charge pump circuit according to claim 13 further comprising a power switching circuit coupled for open circuiting all electrical paths from the first supply voltage to the charging circuit and the discharging circuit in the first state and for providing an electrical path from the first supply voltage to the charging circuit and the discharging circuit in the second state.

15. The low power charge pump circuit according to claim 14 wherein the charging circuit is a P-channel MOS transistor, the discharging circuit is an n-channel MOS transistor and the power switching circuit is a P-channel MOS transistor.

16. The low power charge pump circuit according to claim 11 wherein the jump start input is coupled to control a jump start circuit having a jump start output coupled to provide the predetermined level to the capacitor network.

17. The low power charge pump circuit according to claim 16 wherein the jump start input receives a single control pulse when the charge pump circuit transitions from a power down mode to an active mode.

18. The low power charge pump circuit according to claim 11 wherein the precharge circuit comprises an N-channel MOS transistor coupled between the first supply voltage and the output node.

19. The low power charge pump circuit according to claim 18 wherein the precharge circuit is coupled for control by the ring enable input and the precharge circuit is disabled in the second state.

20. The low power charge pump circuit according to claim 11 wherein the capacitor network comprises a first capacitor coupled between the output node and the second supply voltage, a resistor having a first terminal coupled to the output node and a second capacitor coupled between the second terminal of the resistor and the second supply voltage.

21. The low power charge pump circuit according to claim 20 further comprising a duplicate first capacitor coupled between the output node and the first supply voltage and a duplicate second capacitor coupled between the second terminal of the resistor and the first supply voltage.

22. The low power clocking circuit according to claim 11 wherein the charge pump comprises a charge storage element coupled to generate the output voltage and further wherein the precharge circuit conducts a current during the power down mode wherein the current is merely sufficient to compensate for charge lost from the storage element due to leakage.

23. A charge pump circuit having an active mode for controlling a voltage controlled oscillator and a power down mode for conserving power, the charge pump circuit comprising:

a. a first supply voltage;

b. a second supply voltage;

c. an output node;

d. a capacitor coupled to the output node for maintaining an output voltage;

e. a voltage control circuit coupled between the first supply voltage and the second supply voltage for controlling the output voltage during the active mode; and f. a precharge circuit for maintaining the output voltage at a predetermined precharge level during the power down mode.

24. The low power clocking circuit according to claim 23 wherein the charge pump comprises a charge storage element coupled to generate the output voltage and further wherein the precharge circuit conducts a current during the power down mode wherein the current is merely sufficient to compensate for charge lost from the storage element due to leakage.

25. A charge pump circuit having an active mode for controlling a voltage controlled oscillator and a power down mode for conserving power, the charge pump circuit comprising:

a. a first supply voltage;
 b. a second supply voltage;
 c. an output node;
 d. a capacitor coupled to the output node for maintaining an output voltage;
 e. a voltage control circuit coupled between the first supply voltage and the second supply voltage for controlling the output voltage during the active mode; and
 f. a ring enable circuit for open circuiting all electrical paths from the first supply voltage to the second supply voltage during the power down mode;
 g. a precharge circuit for maintaining the output voltage at a predetermined precharge level during the power down mode; and
 h. a jump start input for rapidly driving the output voltage to a predetermined level only while the charge pump circuit transitions from a power down mode to an active mode.

26. A low power clocking circuit for generating a clock signal, the clocking circuit having an active mode and a power down mode, the clocking circuit comprising:

a. a crystal oscillator for generating a repetitive digital signal having a first frequency;
 b. a charge pump circuit coupled to receive the repetitive digital signal for generating a control voltage the charge pump circuit having an up input for increasing the control voltage and a down input for decreasing the control voltage wherein the charge pump circuit comprises a jump start input for rapidly driving the output voltage to a predetermined level while the charge pump circuit transitions from the power down mode to the active mode;
 c. a precharge circuit for maintaining the control voltage at a predetermined precharge level during the power down mode; and
 d. a voltage controlled oscillator coupled to receive the control voltage and generate a clock signal having a second frequency wherein the second frequency is higher than the first frequency.

27. The low power clocking circuit according to claim 26 further comprising a supply voltage, a ground and a ring enable input for open circuiting all electrical paths from the supply voltage to the ground during the power down mode.

28. The low power clocking circuit according to claim 26 wherein the charge pump comprises a charge storage element coupled to generate the control voltage and further wherein the precharge circuit conducts a current during the power down mode wherein the current is merely sufficient to compensate for charge lost from the storage element due to leakage.

* * * * *